United States Patent
Schricker et al.

(10) Patent No.: US 9,324,926 B2
(45) Date of Patent: Apr. 26, 2016

(54) WAVELENGTH CONVERTED LIGHT EMITTING DEVICE

(71) Applicant: KONINKLIJKE PHILIPS N.V., Eindhoven (NL)

(72) Inventors: April Dawn Schricker, Eindhoven (NL); Kim Kevin Mai, Eindhoven (NL); Grigoriy Basin, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 14/439,368

(22) PCT Filed: Oct. 25, 2013

(86) PCT No.: PCT/IB2013/059647
§ 371 (c)(1),
(2) Date: Apr. 29, 2015

(87) PCT Pub. No.: WO2014/072865
PCT Pub. Date: May 15, 2014

(65) Prior Publication Data
US 2015/0280083 A1 Oct. 1, 2015

Related U.S. Application Data

(60) Provisional application No. 61/723,341, filed on Nov. 7, 2012.

(51) Int. Cl.
| | | |
|---|---|---|
| *H01L 21/00* | (2006.01) | |
| *H01L 33/56* | (2010.01) | |
| *H01L 25/075* | (2006.01) | |
| *H01L 33/50* | (2010.01) | |
| *H01L 27/15* | (2006.01) | |
| *H01L 33/54* | (2010.01) | |
| *H01L 33/60* | (2010.01) | |
| *H01L 33/44* | (2010.01) | |
| *H01L 33/46* | (2010.01) | |

(52) U.S. Cl.
CPC ............ *H01L 33/56* (2013.01); *H01L 25/0753* (2013.01); *H01L 27/156* (2013.01); *H01L 33/50* (2013.01); *H01L 33/54* (2013.01); *H01L 33/60* (2013.01); *H01L 33/44* (2013.01); *H01L 33/46* (2013.01); *H01L 2924/0002* (2013.01); *H01L 2933/0041* (2013.01)

(58) Field of Classification Search
CPC ............................... H01L 33/56; H01L 33/60
USPC ......................................... 257/88, 98; 438/27
See application file for complete search history.

(56) References Cited

U.S. PATENT DOCUMENTS

| | | | |
|---|---|---|---|
| 7,256,483 B2 | 8/2007 | Epler | |
| 7,875,533 B2 | 1/2011 | Epler | |
| 2006/0284207 A1 | 12/2006 | Park | |
| 2010/0258830 A1* | 10/2010 | Ide | H01L 33/60 257/98 |
| 2011/0031516 A1 | 2/2011 | Basin et al. | |
| 2012/0211774 A1* | 8/2012 | Harada | H01L 33/56 257/88 |
| 2012/0235169 A1* | 9/2012 | Seko | H01L 33/60 257/88 |

FOREIGN PATENT DOCUMENTS

EP 2221885 8/2010

* cited by examiner

*Primary Examiner* — Trung Q Dang

(57) ABSTRACT

A structure according to embodiments of the invention includes a plurality of LEDs attached to a mount. A wavelength converting layer is disposed over the LEDs. A transparent layer is disposed over the wavelength converting layer. Reflective material is disposed between neighboring LEDs.

12 Claims, 3 Drawing Sheets

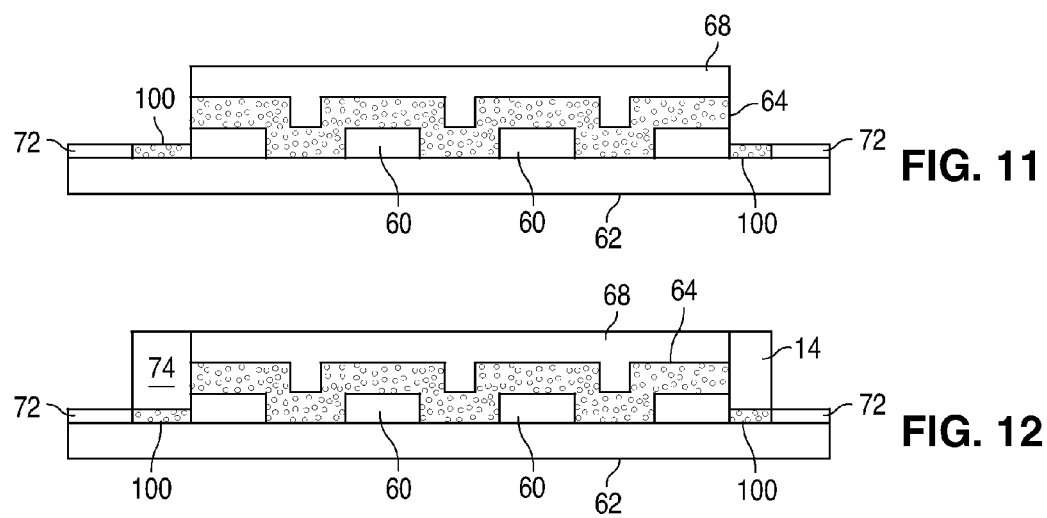

WAVELENGTH CONVERTED LIGHT EMITTING DEVICE

CROSS-REFERENCE TO PRIOR APPLICATIONS

This application is the U.S. National Phase application under 35 U.S.C. §371 of International Application No. PCT/IB2013/059647, filed on Oct. 25, 2013, which claims the benefit of U.S. patent application No. 61/723341, filed on Nov. 7, 2012. These applications are hereby incorporated by reference herein.

FIELD OF THE INVENTION

The present invention relates to a wavelength converted light emitting device with a protective film.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a flip chip LED described in more detail in U.S. Pat. No. 7,256,483. The LED includes n-type layers 16, an active layer 18, and p-type layers 20 grown on a sapphire growth substrate (not shown). Portions of the p-layer 20 and active layer 18 are etched away during the LED forming process, and metal 50 (metallization layer plus bonding metal) contacts the n-layer 16 on the same side as the p-contact metal 24. An underfill material 52 may be deposited in the voids beneath the LED to reduce thermal gradients across the LED, add mechanical strength to the attachment between the LED and the package substrate, and prevent contaminants from contacting the LED material. The n-metal 50 and p-metal 24 are bonded to the pads 22A and 22B, respectively, on a package substrate 12. Contact pads 22A and 22B on package substrate 12 are connected to solderable electrodes 26A and 26B using vias 28A and 28B and/or metal traces. The growth substrate is removed, exposing a surface of n-type layer 16. This surface is roughened for increased light extraction, for example by photo-electrochemical etching using a KOH solution.

SUMMARY

It is an object of the invention to provide a wavelength converted device where the wavelength converting layer is protected.

A structure according to embodiments of the invention includes a plurality of LEDs attached to a mount. A wavelength converting layer is disposed over the LEDs. A transparent layer is disposed over the wavelength converting layer. Reflective material is disposed between neighboring LEDs.

A method according to embodiments of the invention includes providing a plurality of LEDs attached to a mount, forming a wavelength converting layer over the LEDs and the mount, and forming a protective layer over the wavelength converting layer. A portion of the wavelength converting layer and the protective layer are removed. After removing the wavelength converting layer and the protective layer, a reflective layer is formed in the region where the wavelength converting layer and the protective layer were removed.

BRIEF DESCRIPTION OF THE DRAWINGS

FIG. 11 illustrates the structure of FIG. 10 after removing the wavelength converting layer over bonding pads near the edge of the mount.

FIG. 12 illustrates the structure of FIG. 11 after forming a reflective layer over the structure and thinning the reflective layer.

DETAILED DESCRIPTION

Embodiments of the invention include a light emitting device such as an LED combined with a wavelength converting layer. A transparent protective film is formed over the wavelength converting layer. Though in the examples below the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 2:
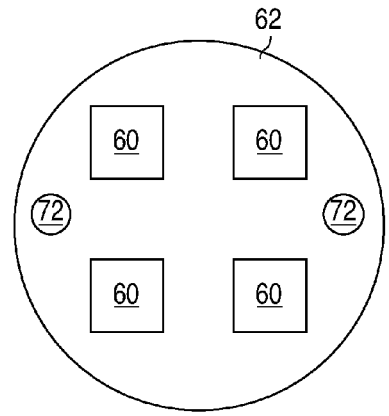
FIG. 2 is a plan view of a group of LEDs disposed on a mount.

FIG. 2 is a plan view of a group of LEDs 60 attached to a mount. In FIG. 2, four LEDs 60 are illustrated attached to mount 62 in a two by two array. Any number of LEDs 60 may be attached to mount 62 in any suitable arrangement, as dictated by the application. In some embodiments, bond pads 72 on mount 62 are used to supply power to the LEDs 60.

Figure 1:
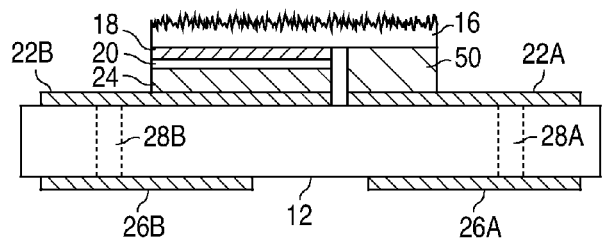
FIG. 1 illustrates a flip chip LED with a roughened top surface.

LED 60 in the following figures may be, for example, a flip chip device configured to emit a majority of light from the top surface of the LED. One example of a suitable LED 60 is illustrated in FIG. 1, though any suitable LED may be used. To form a III-nitride LED, a III-nitride semiconductor structure is first grown on a growth substrate, as is known in the art. The growth substrate may be any suitable substrate such as, for example, sapphire, SiC, Si, GaN, or a composite substrate. The semiconductor structure includes a light emitting or active region sandwiched between n- and p-type regions. An n-type region may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick light emitting layers separated by barrier layers. A p-type region may then be grown over the light emitting region. Like the n-type region, the p-type region may include multiple layers of different composition, thickness, and dopant concentration, including layers that are not intentionally doped, or n-type layers. The total thickness of all the semiconductor material in the device is less than 10 μm in some embodiments and less than 6 μm in some embodiments. In some embodiments, the p-type region is grown first, followed by the active region and the n-type region.

A metal p-contact is formed on the p-type region. If a majority of light is directed out of the semiconductor structure through a surface opposite the p-contact, such as in a flip chip device, the p-contact may be reflective. A flip chip device may be formed by patterning the semiconductor structure by standard photolithographic operations and etching the semiconductor structure to remove a portion of the entire thickness of the p-type region and a portion of the entire thickness of the light emitting region, to form a mesa which reveals a surface of the n-type region on which a metal n-contact is formed. The mesa and p- and n-contacts may be formed in any suitable manner. Forming the mesa and p- and n-contacts is well known to a person of skill in the art.

Figure 3:
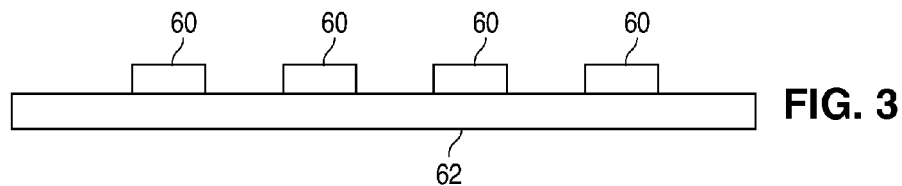
FIG. 3 is a cross sectional view of LEDs disposed on a mount.

FIG. 3 is a simplified cross sectional view of four LEDs 60 attached to mount 62. The LEDs 60 may be connected to mount 62 through the p- and n-contacts, via gold stud bumps or any other suitable connection mechanism. An underfill material such as epoxy, silicone, or any other suitable material may be injected in any spaces beneath LEDs 60, between the LEDs 60 and the mount 62. The mount 62 and underfill may mechanically support the semiconductor structure during later processing steps, such as removing the growth substrate. Any suitable mount may be used. Examples of suitable mounts include an insulating or semi-insulating wafer with conductive vias for forming electrical connections to the semiconductor structure, such as a silicon wafer or a ceramic wafer, a metal structure, or any other suitable mount. In some embodiments, thick metal bonding pads are formed on the semiconductor structure to support the semiconductor structure during processing such as removing the growth substrate. The growth substrate may be partially or totally removed, before or after attaching LEDs 60 to mount 62, or the growth substrate may remain part of the device. The semiconductor structure exposed by removing the growth substrate may be roughened, patterned, or textured to increase light extraction.

Figure 4:
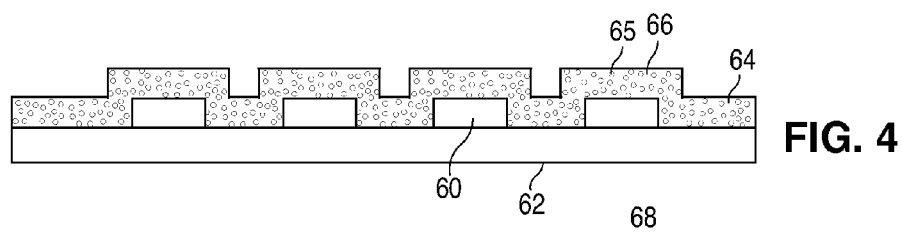
FIG. 4 illustrates the structure of FIG. 3 after forming a wavelength converting layer over the LEDs.

In FIG. 4, a wavelength converting layer 64 is disposed over LEDs 60 and mount 62. Wavelength converting layer 64 includes one or more wavelength converting materials 65 disposed in a transparent material 66. Wavelength converting material(s) 65 absorb light emitted by LEDs 60 and emit light of a different wavelength. Unconverted light emitted by LEDs 60 is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light emitted from the structure.

The wavelength converting material(s) 65 may be conventional phosphors, organic phosphors, quantum dots, organic semiconductors, II-VI or III-V semiconductors, II-VI or III-V semiconductor quantum dots or nanocrystals, dyes, polymers, or materials that luminesce. Any suitable powder phosphor may be used, including but not limited to garnet-based phosphors such as $Y_3Al_5O_{12}$:Ce (YAG), $Lu_3Al_5O_{12}$:Ce (LuAG), $Y_3Al_{5-x}Ga_xO_{12}$:Ce (YAlGaG), $(Ba_{1-x}Sr_x)SiO_3$:Eu (BOSE), and nitride-based phosphors such as (Ca,Sr)AlSiN$_3$:Eu and $(Ca,Sr,Ba)_2Si_5N_8$:Eu.

Transparent material 66 may be, for example, silicone, epoxy, glass, or any other suitable material. Wavelength converting layer 64 may be formed by screen printing, spray coating, stenciling, molding, laminating, or any other suitable technique. Wavelength converting layer 64 may include a single wavelength converting material, a mixture of wavelength converting materials, or multiple wavelength converting materials formed as separate layers rather than mixed together. Wavelength converting materials emitting different colors of light may be disposed in separate regions or mixed together.

The thickness of wavelength converting layer 64 depends on the wavelength converting materials and the deposition technique. The thickness of the wavelength converting regions may be at least 0.5 μm in some embodiments, at least 2 μm in some embodiments, at least 40 μm in some embodiments, no more than 60 μm in some embodiments, and no more than 100 μm in some embodiments.

In one example, red- and green-emitting powder phosphors are mixed with silicone. The mixture is cast into a film. The phosphor materials and amounts of phosphor mixed into the silicone are selected to complement the blue light emitted by LEDs 60, such that the mixed blue, green, and red light meets the specification for a given application. The phosphor-loaded silicone film is laminated over LEDs 60 and mount 62.

Figure 5:
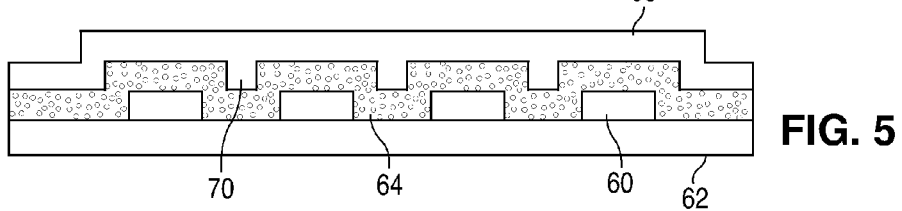
FIG. 5 illustrates the structure of FIG. 4 after forming a transparent layer over the wavelength converting layer.

Any variation in the thickness of wavelength converting layer 64 may undesirably alter the spectrum of mixed light emitted from the structure. Accordingly, in some embodiments, wavelength converting layer 64 is formed such that any variation in the thickness is minimal, for example less than 20% in some embodiments and less than 10% in some embodiments. Any damage to wavelength converting layer 64 may also undesirably alter the spectrum of mixed light. Accordingly, in FIG. 5, a protective layer 68 is formed over wavelength converting layer 64. Protective layer 68 is typically transparent. Any suitable material that protects underlying wavelength converting layer 64 may be used, including, for example, silicone and epoxy. Protective layer 68 may be formed by any suitable technique, including but not limited to spray coating, stenciling, molding, laminating, and spin casting. In one example, a preformed silicone protective film 68 is laminated over wavelength converting layer 64. The thickness of protective film 68 may be at least 0.5 μm in some embodiments, at least 2 μm in some embodiments, no more than 50 μm in some embodiments, and no more than 180 μm in some embodiments.

Figure 6:
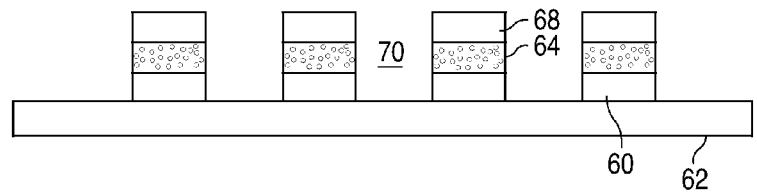
FIG. 6 illustrates the structure of FIG. 5 after removing the wavelength converting layer and transparent layer between the LEDs.

After forming protective film 68, wavelength converting layer 64 and protective film 68 cover the sides of LEDs 60 and are disposed in regions 70 between neighboring LEDs 60. In some embodiments, a structure is formed to prevent light from escaping from the sides of LEDs 60. Accordingly, in FIG. 6, wavelength converting layer 64 and protective film 68 are removed from the regions 70 between neighboring LEDs 60. The material in regions 70 may be removed in some embodiments by sawing through wavelength converting layer 64 and protective film 68, stopping on mount 62. Though FIG. 6 illustrates the entire thickness of wavelength converting layer 64 removed by sawing in the regions between LEDs 60, in some embodiments the protective film 68 and part of wavelength converting layer 64 are removed by sawing, such that part of wavelength converting layer 64 remains in regions 70 after sawing. The portion of wavelength converting layer 64 remaining between LEDs 60 after sawing may be removed in a later processing step or may remain part of the final structure. The width of regions 70 may be at least 100 μm in some embodiments and no more than 500 μm in some embodiments. In some embodiments, a saw that creates a kerf between 125 μm and 225 μm wide is used. The material in regions 70 may be removed with a single saw cut, or with multiple cuts. In some embodiments, the wavelength converting layer 64 and protective film 68 are removed from bond pads 72 illustrated in FIG. 2, such that electrical connection to external structures such as a wire bonds may be formed on bond pads 72. After sawing (and further processing in some embodiments to remove wavelength converting material remaining after sawing), the wavelength converting layer 64 and protective film 68 remain only over the tops of LEDs 60. Wavelength converting layer 64 and protective film 68 are removed from the sides of LEDs 60 and from the regions 70 between LEDs 60.

Figure 7:
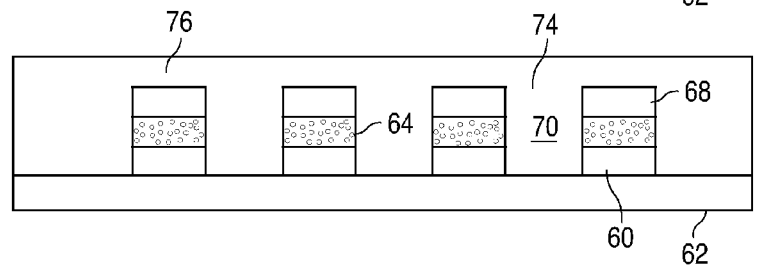
FIG. 7 illustrates the structure of FIG. 6 after forming a reflective layer over the structure.

In FIG. 7, a reflective material 74 is formed over LEDs 60 and mount 62. Reflective material 74 fills the regions 70 between neighboring LEDs 60. Reflective material 74 may be, for example, reflective particles such as $TiO_2$ or aluminum oxide particles disposed in a transparent or reflective supporting matrix, such as silicone. Reflective material layer 74 may be formed by pressing a mixture of reflective particles and supporting matrix into regions 70. As illustrated in FIG. 7, reflective material 74 may be disposed in regions 76 over the tops of LEDs 60.

Figure 8:
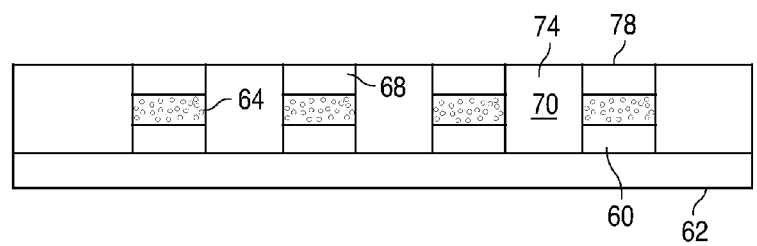
FIG. 8 illustrates the structure of FIG. 7 after thinning the reflective layer to expose the top surface of the transparent layer.

In FIG. 8, reflective material 74 is thinned to expose the tops 78 of protective film 68 over LEDs 60. Protective film 68 protects wavelength converting layer 64 from damage while reflective material 74 is removed. Excess reflective material 74 may be removed by any suitable technique, including for example, etching or mechanical techniques such as micro bead blasting and grinding. In some embodiments, excess reflective material 74 is removed by micro bead blasting and protective film 68 is thick enough to accommodate removal variation of the micro bead blasting without damaging wavelength converting layer 64.

In some embodiments, after excess reflective material 74 is removed, the top surface of the structure illustrated in FIG. 8 is substantially planar. The planar top surface includes the top surface of protective film 78 in the regions where LEDs 60 are located and the top surface of reflective material 74 in the regions between LEDs 60. Reflective material 74 in regions 70 between LEDs 60 prevents light from escaping from the sides of LEDs 60, the sides of wavelength converting layer 64, and the sides of protective film 68, such that a majority of light is extracted through the top of LEDs 60, wavelength converting layer 64, and protective film 68. In some embodiments, reflective material 74 is in direct contact with the sides of LEDs 60, wavelength converting layer 64, and protective film 68, as illustrated in FIG. 8.

In some embodiments, the top surface 78 of protective film 68 is roughened, textured, or patterned to improve light extraction. The roughening, texturing, or patterning on the surface may be formed by the same process that removes excess reflective material 74, or in one or more separate processing steps.

FIGS. 9, 10, 11, and 12 illustrate possible modifications to the process illustrated in FIGS. 4, 5, 6, 7, and 8.

Figure 9:
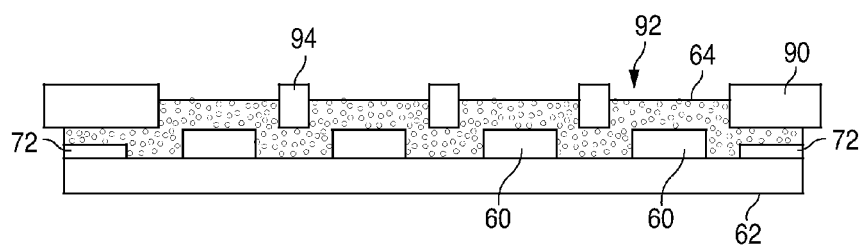
FIG. 9 illustrates a mount and a group of LEDs after forming a wavelength converting layer over the LEDs using a mold.

In FIG. 9, a mold 90 is positioned over the structure, then the wavelength converting layer 64 is formed over the LEDs 60 as described above in reference to FIG. 4. Mold 90 may prevent wavelength converting layer 64 from being formed over bonding pads 72, or may reduce the thickness of wavelength converting material formed over bonding pads 72. Portions 94 of mold 90 may prevent wavelength converting layer 64 from being formed between adjacent LEDs 60, or may reduce the thickness of wavelength converting material formed in these areas. Openings 92 in mold 90 are positioned over LEDs 60.

Figure 10:
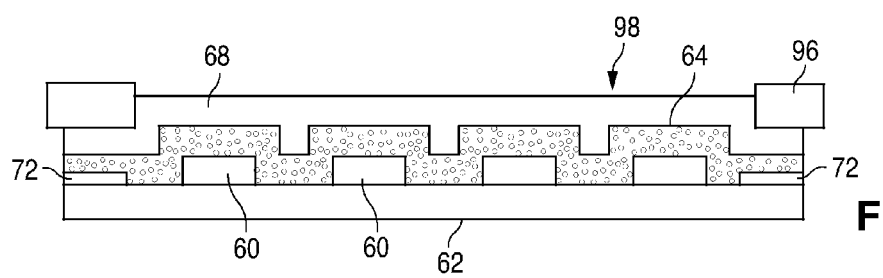
FIG. 10 illustrates the structure of FIG. 9 after forming a transparent layer over the wavelength converting layer, using a mold.

In FIG. 10, a mold 96 is positioned over the structure, then protective film 68 is formed over the structure as described above in reference to FIG. 5. Mold 96 may prevent protective film 68 from being formed over bonding pads 72, or may reduce the thickness of protective material formed over bonding pads 72. Opening 98 in mold 96 is positioned over LEDs 60.

In various embodiments, either of the molds illustrated in FIGS. 9 and 10 may prevent material from being formed over bonding pads 72, over the areas between LEDs 60, or both. Different molds may be used during different processing steps, as illustrated in FIGS. 9 and 10, or the same molds may be used.

In FIG. 11, portions of the protective film 68 and wavelength converting layer 64 are removed, for example by sawing, as described above in reference to FIG. 6. In contrast to FIG. 6, in FIG. 11 only the protective film and wavelength converting layer at the edge of the structure (i.e. the protective film and wavelength converting layer that covers bonding pads 72), is removed. The protective film and wavelength converting layer between LEDs 60 is not removed. Sawing may terminate on bonding pads 72, as illustrated in FIG. 11, such that some wavelength converting material 100 is left between bonding pads 72 and LEDs 60. In some embodiments, sawing terminates partway through the wavelength converting layer 64, such that some wavelength converting material remains over bonding pads 72. Any wavelength converting material remaining over bonding pads 72 after sawing may be removed in a later processing step, for example during microbead blasting to remove excess reflective material 74, described above in reference to FIG. 8.

In FIG. 12, after the sawing illustrated in FIG. 11, a reflective material 74 is formed over the structure, as described above in reference to FIG. 7. The reflective material 74 may be deposited using a mold which may prevent reflective material from being formed over bonding pads 72, or may reduce the thickness of the reflective material formed over bonding pads 72. Excess reflective material covering the top of protective film 68 over LEDs 60 is then removed, as described above in reference to FIG. 8, forming a planar surface in some embodiments. Any reflective material over bonding pads 72 is often removed from bonding pads 72 in order to form electrical contact to bonding pads 72. Any reflective material covering bonding pads 72 may be removed at the same time reflective material covering the top of protective film 68 over LEDs 60 is removed.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A method comprising:
   providing a plurality of LEDs attached to a mount;
   forming a wavelength converting layer over the LEDs and the mount;
   forming a protective layer over the wavelength converting layer;
   removing a portion of the wavelength converting layer and the protective layer; and
   after said removing the wavelength converting layer and the protective layer, forming a reflective layer in the region where a portion of the wavelength converting layer and the protective layer were removed
   wherein the reflective material is in direct contact with a side surface of an LED.

2. The method of claim 1 wherein removing a portion of the wavelength converting layer and the protective layer comprise removing a portion of the wavelength converting layer and the protective layer from regions between the LEDs.

3. The method of claim 1 wherein the mount comprises metal pads disposed on the mount adjacent to the LEDs and removing a portion of the wavelength converting layer and the protective layer comprise removing a portion of the wavelength converting layer and the protective layer from regions over the metal pads.

4. The method of claim 1 wherein forming a wavelength converting layer comprises laminating a film of wavelength converting material disposed in a transparent material over the plurality of LEDs and the mount.

5. The method of claim 1 wherein forming a protective layer over the wavelength converting layer comprises laminating a silicone layer over the wavelength converting layer.

6. The method of claim 1 wherein removing the wavelength converting layer and the protective layer comprises sawing the wavelength converting layer and the protective layer.

7. The method of claim 6 wherein sawing terminates on the mount.

8. The method of claim 6 wherein sawing terminates on a metal pad disposed on the mount.

9. The method of claim 6 wherein sawing terminates within the wavelength converting layer.

10. The method of claim 1 wherein forming a reflective layer comprises forming a reflective layer over the protective layer formed over the LEDs, the method further comprising thinning the reflective layer to expose a top surface of the protective layer.

11. The method of claim 1 further comprising planarizing a top surface, the top surface comprising a top surface of the protective layer in regions where the LEDs are located and a top surface of the reflective layer in regions between the LEDs.

12. A method comprising:
   providing a plurality of semiconductor light emitting devices attached to a mount;
   forming a wavelength converting layer over the semiconductor light emitting devices and the mount, the wavelength converting layer comprising a wavelength converting material disposed in a transparent material;
   forming a transparent layer over the wavelength converting layer;
   sawing away a portion of the wavelength converting layer and the transparent layer;
   forming a reflective layer over the transparent layer and in a region where the portion of the wavelength converting layer and the transparent layer are sawn away; and
   removing a portion of the reflective layer to form a planar surface
   wherein the reflective material is in direct contact with a side surface of an LED.

\* \* \* \* \*